(12) United States Patent
Lee

(10) Patent No.: US 6,647,572 B2
(45) Date of Patent: Nov. 18, 2003

(54) CUSHION HAVING EMBEDDED THEREIN VIBRATING MOTORS

(76) Inventor: Kwang-Ho Lee, 1-ho, Yugyo-ri 510, Gunnae-myun, Pochon-gun, Kyonggi-do (KR)

( * ) Notice: Subject to any disclaimer, the term of this patent is extended or adjusted under 35 U.S.C. 154(b) by 0 days.

(21) Appl. No.: 10/213,163

(22) Filed: Aug. 6, 2002

(65) Prior Publication Data

US 2003/0131416 A1 Jul. 17, 2003

(30) Foreign Application Priority Data

Jan. 11, 2002 (KR) .................................. 2002-0000959

(51) Int. Cl.[7] .......................... A47C 20/00; A61H 1/00
(52) U.S. Cl. ...................... 5/639; 5/641; 5/915; 601/57
(58) Field of Search ........................... 5/636, 639, 641, 5/915; 601/56, 57, 58, 59, 60

(56) References Cited

U.S. PATENT DOCUMENTS

| | | | | |
|---|---|---|---|---|
| 2,687,717 A | * | 8/1954 | Murphy ....................... | 601/57 |
| 2,840,071 A | * | 6/1958 | McNair ........................ | 601/57 |
| 2,943,621 A | * | 7/1960 | Phillips et al. ................. | 5/915 |
| 4,872,229 A | * | 10/1989 | Brady .......................... | 5/915 |
| 4,935,972 A | * | 6/1990 | Brady .......................... | 601/57 |
| 5,038,431 A | * | 8/1991 | Burgin et al. .................. | 5/641 |
| 5,732,426 A | * | 3/1998 | Furuya et al. ................. | 5/641 |
| 5,771,514 A | * | 6/1998 | Wilhoit ........................ | 5/644 |
| 5,819,347 A | * | 10/1998 | Masuda ....................... | 5/641 |
| 6,024,407 A | * | 2/2000 | Eakin .......................... | 5/915 |
| 6,175,981 B1 | * | 1/2001 | Lizama et al. ................. | 5/915 |
| 6,236,621 B1 | * | 5/2001 | Schettino ..................... | 5/639 |
| 6,378,150 B1 | | 4/2002 | Minegishi et al. ............ | 5/652.1 |
| 6,438,779 B1 | * | 8/2002 | Brown ......................... | 5/915 |

FOREIGN PATENT DOCUMENTS

EP     1192882 A2    9/2001
WO     WO9913814     9/1998

* cited by examiner

*Primary Examiner*—Heather Shackelford
*Assistant Examiner*—Frederick L. Lagman
(74) *Attorney, Agent, or Firm*—Seth Natter; Natter & Natter

(57) ABSTRACT

Disclosed is a cushion. The cushion comprises a sponge having a predetermined length and a circular cylinder-shaped configuration; a plurality of vibrating motors embedded in the sponge; an inner envelope opened at one end thereof, for allowing the sponge to be inserted therein, with a predetermined space defined therebetween; cushioning segments filled into the space defined between the sponge and the inner envelope; a frame made of plastic material and fitted into the opened one end of the inner envelope to be brought at one end thereof into contact with the sponge, the frame having a cylindrical configuration; a rechargeable battery positioned in the frame and connected through electric wires to the vibrating motors; a frame cover fastened to the frame to close the other end of the frame; an aromatic case fixed to an inner surface of the frame cover to be positioned in the frame and receive therein an aromatic; an aromatic case cover attached to the frame cover and defined with a plurality of slots which are opened and closed by a plurality of sliding plates, respectively, so that an amount of the aromatic which is given out through the slots can be adjusted; and an outer envelope made of cloth and capable of being opened and closed at one end thereof, for enclosing the resultant combination.

6 Claims, 3 Drawing Sheets

CUSHION HAVING EMBEDDED THEREIN VIBRATING MOTORS

BACKGROUND OF THE INVENTION

1. Field of the Invention

The present invention relates to a cushion for allowing a person to have a good sleep in a comfortable posture upon retiring and to thereby be relieved from fatigue within a short period of time, and more particularly, the present invention relates to a cushion in which a plurality of vibrating motors are embedded in a sponge of a circular cylinder-shaped configuration, a rechargeable battery is connected to the vibrating motors, a frame made of plastic material is arranged at one end of the sponge, the sponge and the frame are inserted into an inner envelope opened at one end thereof, cushioning segments are filled into a space defined between the sponge and the inner envelope, and the resultant combination is enclosed by an outer envelope made of cloth and capable of being opened and closed at one end thereof. Upon retiring, the cushion according to the present invention, having embedded therein the vibrating motors, can be carried in the bosom or placed underneath the waist, or otherwise the legs fatigued with activities through the day can be put on the cushion, whereby a person can have a good sleep in a comfortable posture. Also, the person can be relieved from fatigue due to a massaging effect rendered by the vibrating motors and anions generated from the inner envelope coated with ceramic powder.

2. Description of the Related Art

Generally, a cushion can be used to support the back of the human body when a person sits on a sofa, chair, or the like. The cushion comprises a soft bag of cloth, leather or rubber, filled with cotton, feathers, air, foam rubber, etc. The cushion serves as living necessaries which help to relieve fatigue of the human body while the person sits on the sofa, chair, or the like, for a lengthy period of time.

If a person sleeps for extended hours in an uncomfortable posture only using a quilt and a pillow, muscular pain can be caused and fatigue of the human body is not properly relieved so that the person cannot have a good sleep. As fatigue builds up, a sleeping posture of the person is made uncomfortable again. In this way, a vicious circle is caused.

While the conventional cushion can be used upon retiring to help a person to have a comfortable sleeping posture capable of relieving fatigue, in a manner such that the cushion is carried in the bosom or the fatigued legs are put on the cushion, problems are provoked in that the person can feel heat due to the presence of the cushion in the summertime, and the cushion cannot perform any other functions such as massaging the human body or generating anions.

SUMMARY OF THE INVENTION

Accordingly, the present invention has been made in an effort to solve the problems occurring in the related art, and an object of the present invention is to provide a cushion having embedded therein vibrating motors, which can be carried in the bosom or placed underneath the waist and on which the legs fatigued with activities through the day can be put, thereby allowing a person to have a good sleep in a comfortable posture, so that the person can be relieved from fatigue due to a massaging effect rendered by the vibrating motors and anions generated from an inner envelope coated with ceramic powder, the cushion providing an aesthetic appearance while permitting mass production and capable of being used throughout the year by simply changing an outer envelope thereof.

In order to achieve the above object, according to the present invention, there is provided a cushion comprising: a sponge having a circular cylinder-shaped configuration; a plurality of vibrating motors embedded in the sponge; a rechargeable battery connected to the vibrating motors to supply power to the vibrating motors; a frame made of plastic material, arranged at one end of the sponge and having accommodated therein the rechargeable battery and an aromatic case; an inner envelope opened at one end thereof, for allowing the sponge and frame to be inserted therein; cushioning segments filled into a space defined between the sponge and the inner envelope; and an outer envelope capable of being opened and closed at one end thereof, for enclosing the resultant combination, and made of cloth.

By the feature of the present invention, upon retiring, the cushion according to the present invention, having embedded therein the vibrating motors, can be carried in the bosom or placed underneath the waist, or otherwise the legs fatigued with activities through the day can be put on the cushion, whereby a person can have a good sleep in a comfortable posture. The person can be relieved from fatigue due to a massaging effect rendered by the vibrating motors and anions generated from the inner envelope coated with ceramic powder. Also, the cushion can be used throughout the year, irrespective of season, by simply changing the outer envelope.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
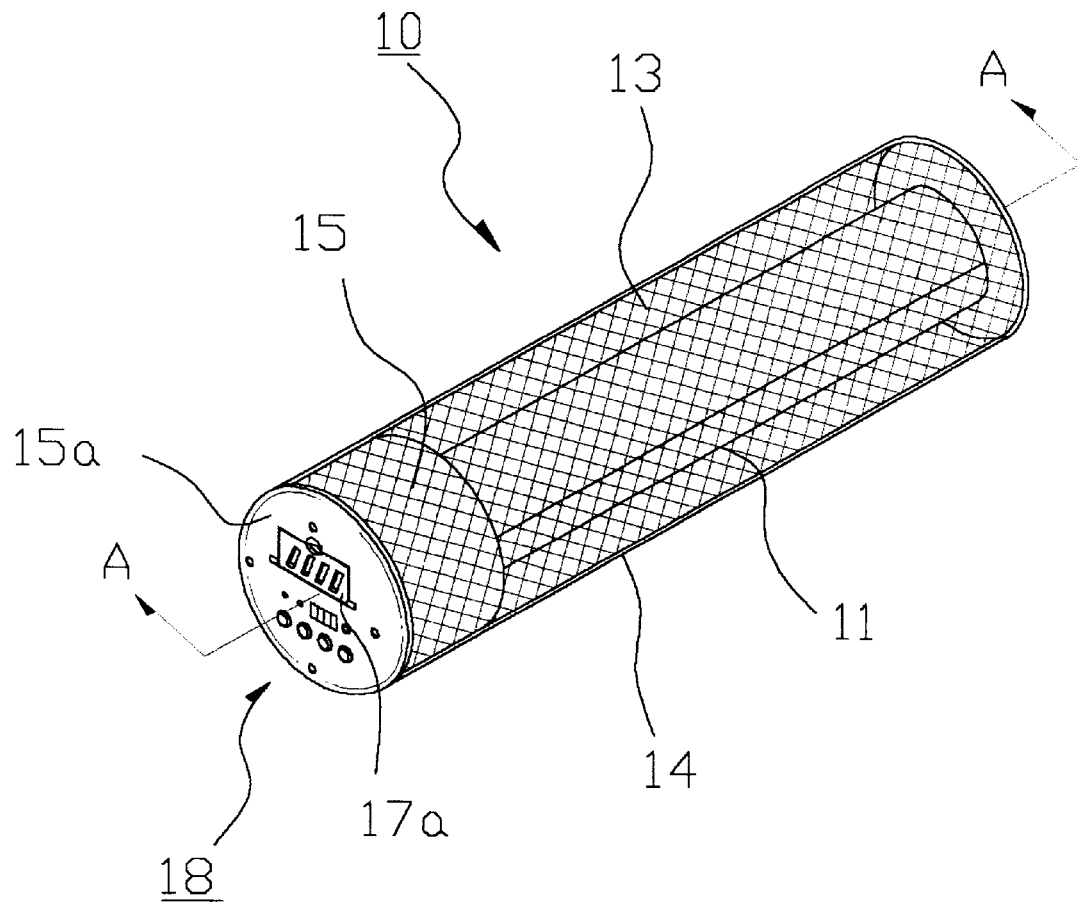
FIG. 1 is a perspective view illustrating a cushion having embedded therein vibrating motors in accordance with an embodiment of the present invention.

Reference will now be made in greater detail to a preferred embodiment of the invention; an example of which is illustrated in the accompanying drawings. Wherever possible, the same reference numerals will be used throughout the drawings and the description to refer to the same or like parts.

Figure 2:
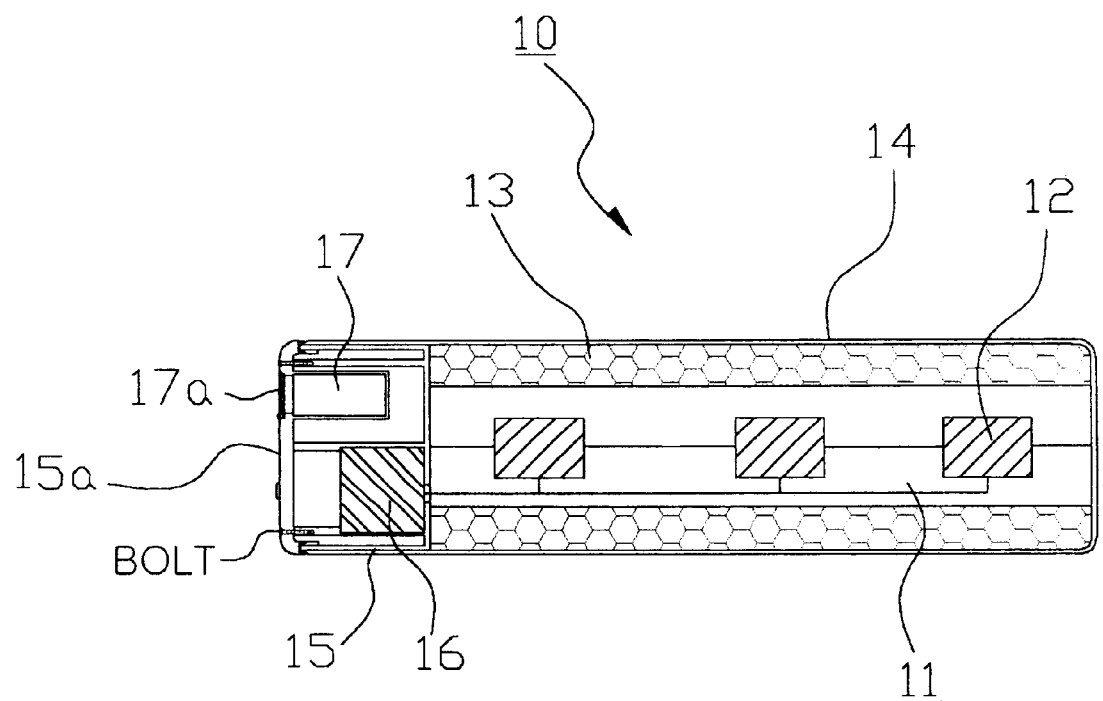
FIG. 2 is a cross-sectional view taken along the line A—A of FIG. 1.
Figure 3:
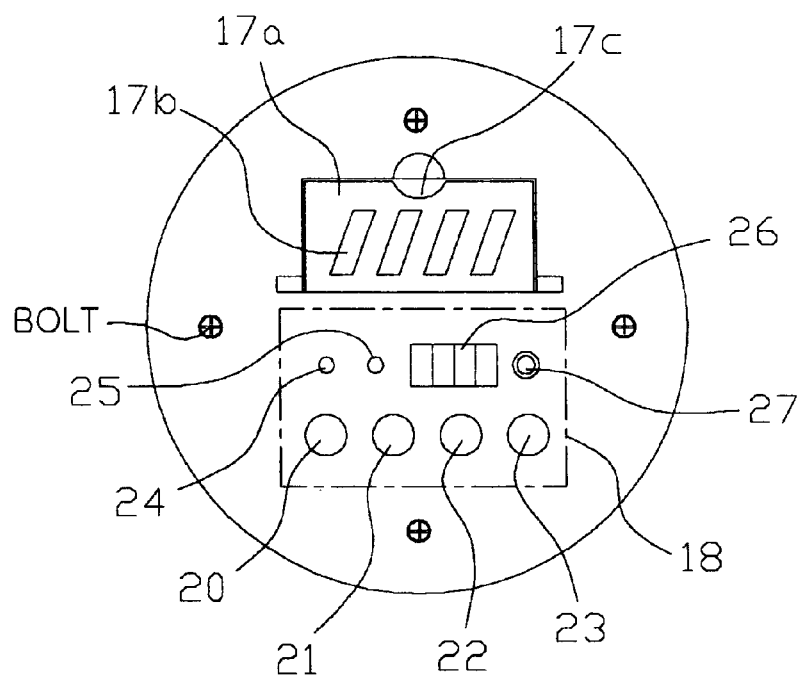
FIG. 3 is a front view of the cushion according to the present invention.

Referring to FIGS. 1 through 3, a cushion 10 in accordance with an embodiment of the present invention comprises a sponge 11 having a predetermined length and a circular cylinder-shaped configuration. A plurality of vibrating motors 12 are embedded in the sponge 11. An inner envelope 14 is opened at one end thereof, to allow the sponge 11 to be inserted therein, with a predetermined space defined therebetween. Cushioning segments 13 are filled into the space defined between the sponge 11 and the inner envelope 14. A frame 15 made of plastic material is fitted into the opened one end of the inner envelope 14 to be brought, at one end thereof, into contact with the sponge 11. The frame 15 has a cylindrical configuration. A rechargeable battery 16 is fixedly positioned in the frame 15 and connected through electric wires to the vibrating motors 12. A frame cover 15a is fastened to the frame 15 to close the other end of the frame 15. An aromatic case 7 is fixed to an inner surface of the frame cover 15a to be positioned in the frame 15 and receive therein an aromatic. An aromatic case cover 17a is detachably attached to the frame cover 15a. The aromatic case cover 17a is defined with a plurality of slots which are opened and closed by a plurality of sliding plates 17b, respectively, so that an amount of the aromatic which is given out through the slots can be adjusted. An outer envelope 28, which is made of cloth and capable of being opened and closed at one end thereof, encloses the resultant combination.

A control section 18 having a plurality of buttons for controlling operations of the vibrating motors 12 is installed on the frame cover 15a.

The inner envelope 14 comprises an inner mesh and an outer cloth which is coated with ceramic powder to generate anions and stitched with the inner mesh.

The cushioning segment 13 may be made of various substances including plastic having a cylindrical configuration, millet, chaff, buckwheat, feathers, etc.

The control section 18 comprises a power button 20, a power lamp 24 for showing a power input state, an LCD charge indicator 26 for indicating a charged amount of the rechargeable battery 16, a DC jack 27 to be directly connected to a power source, a high speed button 22 and a low speed button 23 for changing a rotational speed of the vibrating motors 12, and a manual button 21 for individually driving the vibrating motors 12 each time being pressed. As for a control circuit, since it can be constructed according to the conventional art, detailed explanation thereof shall be omitted herein.

Figure 4:
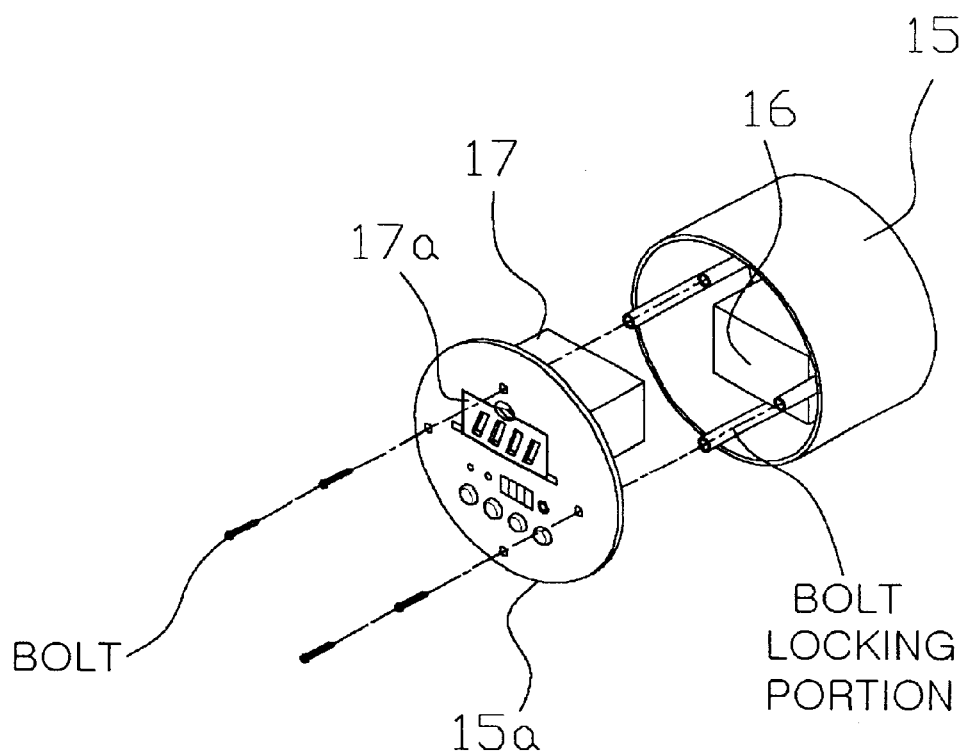
FIG. 4 is a perspective view illustrating a coupling structure of a cover plate with respect to a frame.

Referring to FIG. 4, the frame 15 is made of plastic material as described above. The frame cover 15a has substantially a recessed configuration. A bottom portion of the frame cover 15a is defined with an opening in a manner such that the aromatic case cover 17a is received in the opening to be detachably attached to the frame 15. The aromatic case cover 17a has a groove 17c in a manner such that the aromatic case cover 17a can be opened in one direction by inserting a finger into the groove 17c to allow the aromatic to be replenished into the aromatic case 17. The aromatic case cover 17a is defined with the plurality of slots which are opened and closed by the plurality of sliding plates 17b, respectively, so that an amount of the aromatic which is given out through the slots can be adjusted. The control section 18 is installed on a center portion of the frame cover 15a.

Figure 5:
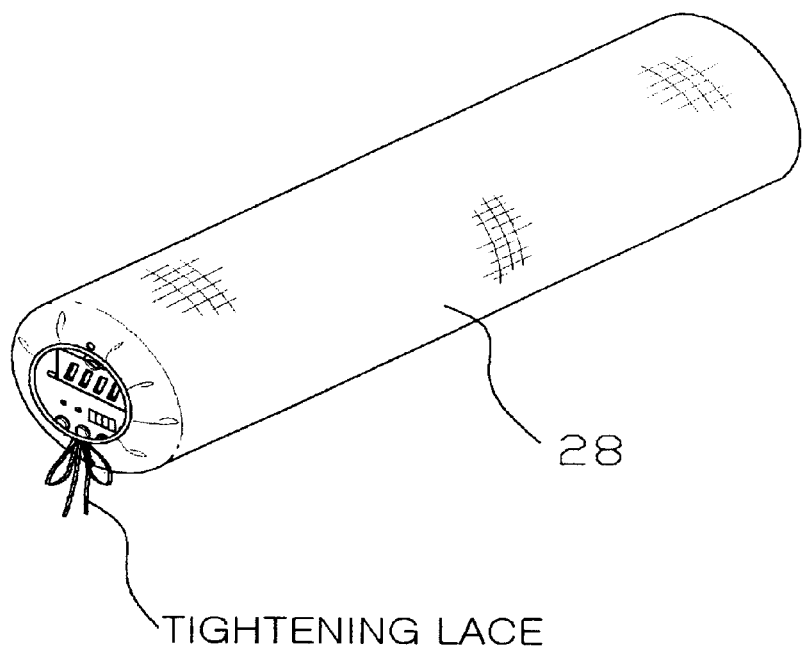
FIG. 5 is a perspective view illustrating the cushion which is ready to be used.

Referring to FIG. 5, in the cushion 10 according to the present invention, the outer envelope 28 can be made of various substances capable of enclosing the aforementioned combination. In this regard, it is preferred that the outer envelope 28 is made of hemp cloth or ramie fabric to allow a user to feel refreshed in the summertime and of heat insulating material to allow the user to feel warmed in the wintertime. By enclosing the aforementioned combination using the outer envelope 28 formed in this way, it is possible to prevent the combination from being contaminated. The outer envelope 28 can be easily removed and cleaned to render to the user agreeable touch.

By the above-described construction, the cushion 10 according to the present invention can be carried in the bosom, placed between or under the legs, or used in place of a pillow, with the outer envelope 28 enclosing the aforementioned combination made of hemp cloth or ramie fabric to allow the user to have a sleep while feeling refreshed in the summertime. At this time, due to the fact that anions are generated from the inner envelope 14 which has the outer cloth coated with the ceramic powder, the user can be relieved from fatigue and recruited within a short period of time. When it is desired to massage fatigued muscles, by pushing the power button 20 of the control section 18 installed on the frame cover 15a, the power lamp 24 is turned on and the plurality of vibrating motors 12 embedded in the sponge 11 are vibrated to perform a massaging function. The massaging function can be realized in a diversity of ways due to the presence of the plurality of buttons provided to the control section 18. That is to say, if it is necessary to change a rotational speed of the vibrating motors 12 as desired, the high speed button 22 and the low speed button 23 can be selectively pressed. Further, if the manual button 21 is pressed to individually drive the vibrating motors 12 and locally use the massaging function, as a manual mode lamp 25 is turned on, the vibrating motors 12 are sequentially vibrated every time the manual button 21 is pressed, to massage a desired portion.

Also, a sweet fragrance is emitted through the aromatic case cover 17a from the aromatic received in the aromatic case 17 which is fixed to the inner surface of the frame cover 15a. By opening and closing the plurality of slots defined in the aromatic case cover 17a by the plurality of sliding plates 17b, an amount of the aromatic giving out through the slots can be adjusted.

In the wintertime, by replacing the outer envelope 28 with a new one made of heat insulating material, the cushion 10 according to the present invention can be effectively used while causing the user to feel warmed.

As apparent from the above description, the cushion having embedded therein vibrating motors according to the present invention provides advantages in that, upon retiring, the cushion can be carried in the bosom or placed underneath the waist, or otherwise the legs fatigued with activities through the day can be put on the cushion, whereby a person can have a good sleep in a comfortable posture. Further, the person can be relieved from fatigue due to a massaging effect rendered by the vibrating motors and anions generated from the inner envelope coated with ceramic powder. Moreover, the cushion provides an aesthetic appearance while permitting mass production, and is capable of being used throughout the year, irrespective of season, by simply changing an outer envelope thereof.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A cushion comprising:
   a sponge having a predetermined length and a circular cylinder-shaped configuration;
   a plurality of vibrating motors embedded in the sponge;
   an inner envelope opened at one end thereof, for allowing the sponge to be inserted therein, with a predetermined space defined therebetween;
   cushioning segments filled into the space defined between the sponge and the inner envelope;

a frame made of plastic material and fitted into the opened one end of the inner envelope to be brought at one end thereof into contact with the sponge, the frame having a cylindrical configuration;

a rechargeable battery positioned in the frame and connected through electric wires to the vibrating motors;

a frame cover fastened to the frame to close the other end of the frame;

an aromatic case fixed to an inner surface of the frame cover to be positioned in the frame and receive therein an aromatic;

an aromatic case cover attached to the frame cover and defined with a plurality of slots which are opened and closed by a plurality of sliding plates, respectively, so that an amount of the aromatic which is given out through the slots can be adjusted; and an outer envelope made of cloth and capable of being opened and closed at one end thereof, for enclosing the resultant combination.

2. The cushion as set forth in claim 1, wherein a control section having a plurality of buttons for controlling operations of the vibrating motors is installed on the frame cover.

3. The cushion as set forth in claim 1, wherein the inner envelope comprises an inner mesh and an outer cloth which is coated with ceramic powder and stitched with the inner mesh.

4. The cushion as set forth in claim 1, wherein each cushioning segment is made of plastic material and has a cylindrical configuration.

5. The cushion as set forth in claim 2, wherein the control section comprises a power button, a power lamp for showing a power input state, an LCD charge indicator for indicating a charged amount of the rechargeable battery, a DC jack to be directly connected to a power source, a high speed button and a low speed button for changing a rotational speed of the vibrating motors, and a manual button for individually driving the vibrating motors each time being pressed.

6. The cushion as set forth in claim 1, wherein the outer envelope is made of hemp cloth, ramie fabric, or heat insulating material.

* * * * *